(12) United States Patent
Langenberg et al.

(10) Patent No.: US 7,509,111 B2
(45) Date of Patent: Mar. 24, 2009

(54) INTEGRATED CIRCUIT HAVING A MIXER CIRCUIT

(75) Inventors: Jorg Langenberg, Dorsten (DE);
Thomas Liebermann, Munich (DE);
Werner Simburger, Haar (DE); Marc Tiebout, Munich (DE); Hans-Dieter Wohlmuth, Munich (DE)

(73) Assignee: Infineon Technologies AG, Neubiberg (DE)

( * ) Notice: Subject to any disclaimer, the term of this patent is extended or adjusted under 35 U.S.C. 154(b) by 236 days.

(21) Appl. No.: 10/978,242

(22) Filed: Oct. 29, 2004
(Under 37 CFR 1.47)

(65) Prior Publication Data
US 2005/0118979 A1    Jun. 2, 2005

Related U.S. Application Data

(63) Continuation of application No. PCT/DE03/01204, filed on Apr. 10, 2003.

(30) Foreign Application Priority Data

Apr. 30, 2002    (DE)    ................................ 102 19 335

(51) Int. Cl.
*H04B 1/40*    (2006.01)

(52) U.S. Cl. ...................................... 455/326; 455/333

(58) Field of Classification Search ................. 455/313, 455/314, 318, 323, 326, 333, 334, 324, 325; 330/252, 261, 277, 306, 307
See application file for complete search history.

(56) References Cited

U.S. PATENT DOCUMENTS

| | | | |
|---|---|---|---|
| 4,636,663 A  * | 1/1987 | Jongepier et al. ........... | 327/113 |
| 5,361,409 A | 11/1994 | Vice | |
| 5,826,183 A | 10/1998 | Apel | |
| 6,026,286 A  * | 2/2000 | Long .......................... | 455/327 |
| 6,157,822 A  * | 12/2000 | Bastani et al. .............. | 455/323 |
| 6,184,739 B1 * | 2/2001 | Doyle ......................... | 327/359 |

(Continued)

FOREIGN PATENT DOCUMENTS

| | | |
|---|---|---|
| DE | 101 62 263 A1 | 7/2003 |
| EP | 0 166 626 A2 | 1/1986 |

OTHER PUBLICATIONS

Craninckx, J. et al.;"A 1.8-GHz Low-Phase-Noise CMOS VCO Using Optimized Hollow Spiral Inductors"; IEEE Journal of Solid-State Circuits, vol. 32, No. 5, May 1997, pp. 736-744.

(Continued)

*Primary Examiner*—Blane J Jackson
(74) *Attorney, Agent, or Firm*—Dickstein, Shapiro, LLP.

(57) ABSTRACT

Integrated circuit including a mixer circuit, which has a first circuit section, a second circuit section, and a transformer. The first circuit section has two radiofrequency terminals. The second circuit section has two reference oscillator terminals, an active mixer unit with a signal-amplifying unit, and two intermediate frequency terminals. The active mixer unit and the signal-amplifying unit have a common current path. The transformer directly electrically decouples the two radiofrequency terminals from the active mixer unit, and couples the first circuit section and the second circuit section together such that each of the two circuit sections is separately supplied with a full operating voltage of the integrated circuit. The integrated circuit may additionally include a second transformer connected between the active mixer unit and the two intermediate frequency terminals.

30 Claims, 4 Drawing Sheets

U.S. PATENT DOCUMENTS

| | | | | |
|---|---|---|---|---|
| 6,230,001 B1 * | 5/2001 | Wyse | .......................... | 455/326 |
| 6,510,314 B1 * | 1/2003 | Kuo | .......................... | 455/326 |
| 6,529,721 B1 * | 3/2003 | Tiller | ........................ | 455/323 |
| 6,665,527 B2 * | 12/2003 | Schiltz | ...................... | 455/326 |
| 6,704,559 B1 * | 3/2004 | Hageraats | .................. | 455/326 |
| 6,810,240 B2 * | 10/2004 | Donig et al. | ................ | 455/313 |
| 6,819,914 B2 * | 11/2004 | Yan et al. | .................... | 455/318 |
| 6,999,746 B2 * | 2/2006 | Wang | ........................ | 455/323 |
| 7,113,244 B2 * | 9/2006 | Kaneko et al. | ............. | 349/147 |
| 2002/0032016 A1 | 3/2002 | Ji | | |
| 2002/0058492 A1 * | 5/2002 | Souetinov et al. | .......... | 455/333 |

OTHER PUBLICATIONS

Zannoth, M. et al.;"A Fully Integrated VCO at 2 GHz"; IEEE Journal of Solid-State Circuits, vol. 33, No. 12, Dec. 1998, pp. 1987-1991.

Tiebout, M.;"Low-Power Low-Phase-Noise Differentially Tuned Quadrature VCO Design in Standard CMOS"; IEEE Journal of Solid-State Circuits, vol. 36, No. 7, Jul. 2001, pp. 1018-1024.

Meinke H.H. et al.;"Taschenbuch der Hochfrequenztechnik"; Springer Verlag, 5. Auflage, Band 1, pp. G18-G21, 1992.

Simburger, W. et al.;"A Monolithic Transformer Coupled 5-W Silicon Power Amplifier with 59% PAE at 0.9 GHz"; IEEE Journal of Solid-State Circuits, vol. 34, No. 12, Dec. 1999, pp. 1881-1892.

* cited by examiner

INTEGRATED CIRCUIT HAVING A MIXER CIRCUIT

CROSS-REFERENCE TO RELATED APPLICATION

This application is a continuation of International Patent Application Serial No. PCT/DE03/01204, filed Apr. 10, 2003, which published in German on Nov. 13, 2003 as WO 03/094339, and is incorporated herein by reference in its entirety.

FIELD OF THE INVENTION

The invention relates to an integrated circuit, and in particular to an integrated circuit having a mixer circuit.

BACKGROUND OF THE INVENTION

A mixer circuit serves as a downconverter for the frequency conversion of a radiofrequency signal (radiofrequency=RF) into an intermediate frequency signal (intermediate frequency=IF) or as an upconverter in the opposite direction, a local oscillator signal (LO) being used for the frequency conversion. In this case, the frequency $f_{IF}$ of the intermediate frequency signal results from the frequency $f_{RF}$ of the radiofrequency signal and the frequency $f_{LO}$ of the local oscillator signal in accordance with $f_{IF}=f_{RF}\pm f_{LO}$. An elementary multiplier circuit may already be used as a simple mixer circuit.

An electronic circuit having a mixer circuit is usually used in a modern mobile radio device, for example in a mobile telephone, which is generally battery-operated. This electronic circuit is provided with a voltage controlled local oscillator, which should have in addition to a maximized low noise, owing to the battery operation, a minimized current consumption and also a low operating voltage. Voltage controlled local oscillators, which are also referred to as VCO (voltage controlled oscillator) are known from the prior art, for example from Cranickx J., Steyaert M. S. J.: "A 1.8 GHz low-phase noise CMOS VCO using optimized hollow spiral inductors" in IEEE J. of Solid-State Circuits, vol. 32, No. 5, pp. 736-744 (1997), Zannoth M., Kolb B., Fenk J., Weigel R.: "A Fully Integrated VCO at 2 GHZ" in IEEE J. of Solid-State Circuits, vol. 33, No. 12, pp. 1987-1991 (1998), and Tiebout M.: "Low-Power Low-Phase-Noises Differentially Tuned Quadrature VCO Design in Standard CMOSI" in IEEE J. of Solid-State Circuits, vol. 36, No. 7, pp. 1018-1024 (2001).

The mixer circuit contains a nonlinear component for the frequency conversion. Diodes or transistors may be used as nonlinear components.

A transistor mixer is generally operated actively in order to achieve a maximum conversion gain of the mixer circuit by means of the amplification of the transistor. A transistor mixer can also be operated passively, the transistor channel then being used as a variable resistor.

Among silicon components, at the present time bipolar transistors are preferably used in mixer applications on account of their nonlinear current-voltage characteristic curve having an exponential profile. In the case of a mixer circuit having field effect transistors based on metal oxide semiconductors (MOSFET=metal-oxide semiconductor field effect transistor), nonlinear current-voltage characteristic curves that are characterized by a quadratic function result, as is described in Meinke H. H., Grundlach F. W.: "Taschenbuch der Hochfrequenztechnik" ["Pocket book of radiofrequency technology"] Springer Verlag, 5th edition, volume 1, pp. G18-G21 (1992).

The simplest form of a mixer circuit is the differential amplifier, which multiplies only in two quadrants of the current-voltage characteristic curves. Mixer circuits are generally constructed symmetrically, however, in order to be able to multiply in all four quadrants of the current-voltage characteristic curves. A more exact signal conversion is thereby achieved.

Mixer circuits which are produced by means of modern semiconductor technology and have CMOS transistors (CMOS=complementary metal-oxide semiconductor), for example, have a reduced breakdown voltage at high frequencies to be converted. Consequently, the maximum permissible operating voltage for the mixer circuit is reduced and, in accordance with the prior art, is usually only between 0.9 V and 1.5 V. Since every transistor has an internal resistance, a certain voltage ΔU is dropped across a transistor when current flows through the latter. In order to enable a current flow through the transistors when a plurality of transistors are connected together in series, the operating voltage present across all the transistors must therefore be greater than the sum of the voltages ΔU dropped across the transistors. However, if all the other transistors are in the on state apart from a single transistor in the off state, the entire operating voltage is present across the transistor in the off state. Therefore, the operating voltage should be chosen to be less than the lowest breakdown voltage of the transistors in order to avoid a voltage breakdown in the transistor in the off state. Consequently, the breakdown voltage of the transistors limits the permissible magnitude of the operating voltage applied across all the transistors. This furthermore has the consequence that the number of transistors is limited in the design of an integrated circuit having a plurality of transistors connected in series. Consequently, the number of stackable transistor planes in an integrated circuit, i.e. the number of transistors connected one after the other in series, is limited, in which case it should be noted that there may be a plurality of transistors present in different current paths at the same potential level.

The prior art discloses mixer circuits in which the number of transistor planes is reduced, but not the total number of transistors in the mixer circuit. Such mixer circuits are known by the designation "current-folded" mixer circuit. In the case of "current-folded" mixer circuits, the mixer circuit is divided into a plurality of subcircuits that are electrically coupled to one another in a suitable manner such that said subcircuits in each case have only a few, for example two, transistor planes, as a result of which the operating voltage of the mixer circuit can be reduced. The subcircuits that are electrically coupled to one another in a suitable manner ensure the desired signal flow.

FIG. 2 illustrates a known "current-folded" mixer circuit 200 in accordance with the prior art, which enables the use of more transistors than transistor planes provided despite a low operating voltage. The "current-folded" mixer circuit 200 illustrated in FIG. 2 is a four-quadrant mixer circuit, which is also known by the designation "current-folded double-balanced mixer". In this case, the description "double-balanced" indicates that the local oscillator signal is coupled in uniformly at a plurality of locations in the mixer circuit.

In the "current-folded" mixer circuit 200, a radiofrequency signal RF+ is coupled in via the base of a first npn transistor T1 and the inverted radiofrequency signal RF– with respect to the radiofrequency signal RF+ is coupled in via the base of a second npn transistor T2. The emitters of the two npn transistors T1, T2 are electrically coupled to one another by means of an electrical resistor R1. The emitter of the npn transistor T1 and T2 is electrically coupled to the collector of a controlling third and fourth npn transistor T3 and T4, respectively. A constant control voltage BIAS is present at the base of the controlling third and fourth npn transistor T3 and T4, respectively, and the collector of the controlling third and fourth npn transistor T3 and T4, respectively, is electrically coupled to the ground potential via an electrical resistor R2 and R3, respectively. The collectors of the two npn transistors T1, T2 are electrically coupled to the operating voltage VCC by means of an electrical resistor R4 and R5, respectively.

In addition, the base of a fifth npn transistor T5 is electrically coupled to a first node KN1 between the electrical resistor R4 and the collector of the first npn transistor T1, the collector of said fifth npn transistor likewise being electrically coupled to the operating voltage VCC. Analogously to this, the base of a sixth npn transistor T5 is electrically coupled to a second node KN2 between the electrical resistor R5 and the collector of the second npn transistor T2, the collector of said sixth npn transistor in turn being electrically coupled to the operating voltage VCC. The emitter of the fifth npn transistor T5 is electrically coupled to the collector and, in parallel therewith, to the base of a seventh npn transistor T7 and also to the base of an eighth npn transistor T8. The emitters of the two npn transistors T7, T8 are respectively electrically coupled to the ground potential via an electrical resistor R6, R7. In a comparable manner, the emitter of the sixth npn transistor T6 is electrically coupled to the collector and, in parallel therewith, to the base of a ninth npn transistor T9 and also to the base of a tenth npn transistor T10. The emitters of the two npn transistors T9, T10 are respectively electrically coupled to the ground potential via an electrical resistor R8, R9.

The emitters of two npn transistors T11, T12 and T13, T14 are electrically coupled to the collector of the eighth and tenth npn transistors T8 and T10, respectively. The local oscillator signal LO+ is present at the bases of the two npn transistors T11, T13 and the inverted local oscillator signal LO− with respect to the local oscillator signal LO+ is present at the bases of the two npn transistors T12, T14. The two npn transistors T11, T13 and T12, T14 are electrically coupled to one another by their collectors and, via a respective electrical resistor R10 and R11, to the operating voltage VCC. The intermediate frequency signal IF+ can then be tapped off at a third node KN3 between the collectors of the two npn transistors T12, T13, on the one hand, and the electrical resistor R10, on the other hand, while the inverted intermediate frequency IF− with respect to the intermediate frequency signal IF+ can be tapped off at a fourth node KN4 between the collectors of the two npn transistors T11, T14, on the one hand, and the electrical resistor R11, on the other hand.

Clearly, the "current-folded" mixer circuit 200 constitutes a horizontally constructed Gilbert mixer. However, the "current-folded" mixer circuit 200 has the disadvantage that the current mirrors within the "current-folded" mixer circuit 200 are generally slow. This means that a variation of the radiofrequency signal RF+ (and thus also of the inverted radiofrequency signal RF−) causes a temporally delayed change in the intermediate frequency signal IF+ (and also in the inverted intermediate frequency signal IF−). Consequently, on account of the temporal delay in the "current-folded" mixer circuit 200, the intermediate frequency signal, in the event of conversion from a radiofrequency signal, may have a frequency which is considerably reduced in comparison with the intermediate frequency that is actually to be generated. Since this is undesirable, the "current-folded" mixer circuit 200 can only be operated with low operating frequencies if reliable signal conversion and signal transmission are to be effected.

SUMMARY OF THE INVENTION

The invention is thus based on the problem of specifying an integrated circuit in which radiofrequency electronic signals can be mixed even though the electronic circuit is operated with a reduced operating voltage compared with the prior art.

An integrated circuit has a mixer circuit and a transformer, the mixer circuit having an active mixer unit with a signal-amplifying unit, two reference oscillator terminals, two radiofrequency terminals and two intermediate frequency terminals, and the integrated circuit being set up in such a way that the transformer directly electrically decouples the two radiofrequency terminals from the active mixer unit.

Clearly, the transformer thus acts as an isolating transformer. This has the advantage that it is possible to operate the active mixer unit without loading of the voltages at the two radiofrequency terminals in an autonomous circuit plane.

If the mixer circuit of the integrated circuit is used as an upconverter, the signal-amplifying element has a positive gain characteristic. However, if the mixer circuit of the integrated circuit is used as a downconverter, the signal-amplifying element has, by contrast, a negative gain characteristic.

One advantage of the integrated circuit is that the integrated circuit is divided into a plurality of circuit sections at a suitable location by means of the transformer. Each of these circuit sections can thus be supplied separately with the full operating voltage. Consequently, the transformer makes it possible to reduce the operating voltage for the integrated circuit to half of the overall voltage required.

A further advantage of the integrated circuit is that the integrated circuit can also convert radiofrequency signals without a significant loss of information. It is additionally advantageous that the integrated circuit can be produced by means of standard processes in semiconductor technology.

In a preferred embodiment of the integrated circuit, the signal-amplifying unit is formed as an input amplifier of the active mixer unit.

The integrated circuit preferably has an amplifier circuit between the two radiofrequency terminals and the transformer. This has the advantage that the operating voltages in the individual circuit sections can be reduced further.

The integrated circuit preferably has at least one filter element. The filter element, for its part, preferably has a cascode. A cascode reduces parasitic capacitances and thus affords the advantage that even relatively high frequencies can be processed in the integrated circuit and not be unintentionally filtered out. In addition or as an alternative, the filter element may have a bandpass filter. The bandpass filter is preferably realized by means of at least one capacitor.

In the integrated circuit, a cascode is preferably connected between the two radiofrequency terminals and the transformer. A cascode is preferably also connected between the transformer and the active mixer unit. Moreover, a cascode may be connected between the active mixer unit and the two intermediate frequency terminals.

In a preferred embodiment of the integrated circuit, an additional transformer is connected between the active mixer unit and the two intermediate frequency terminals.

The transformer is preferably a monolithic transformer that has been produced monolithically on the substrate on which the integrated circuit is provided. If an additional transformer is provided in the integrated circuit, it is preferably likewise produced monolithically.

A preferred embodiment of the integrated circuit has a control element for setting the operating point of the integrated circuit. In this case, said control element is preferably a controllable inductive component.

In a preferred embodiment of the integrated circuit, the active mixer unit and/or the amplifier circuit and/or the cascode have/has at least one field effect transistor. Clearly, the integrated circuit is thus constructed on a transistor basis.

The mixer circuit of the integrated circuit may be, in particular, a Gilbert mixer.

BRIEF DESCRIPTION OF THE DRAWINGS

Exemplary embodiments of the invention are illustrated in the figures and are explained in more detail below.

DETAILED DESCRIPTION OF PREFERRED EMBODIMENTS OF THE INVENTION

Figure 1:
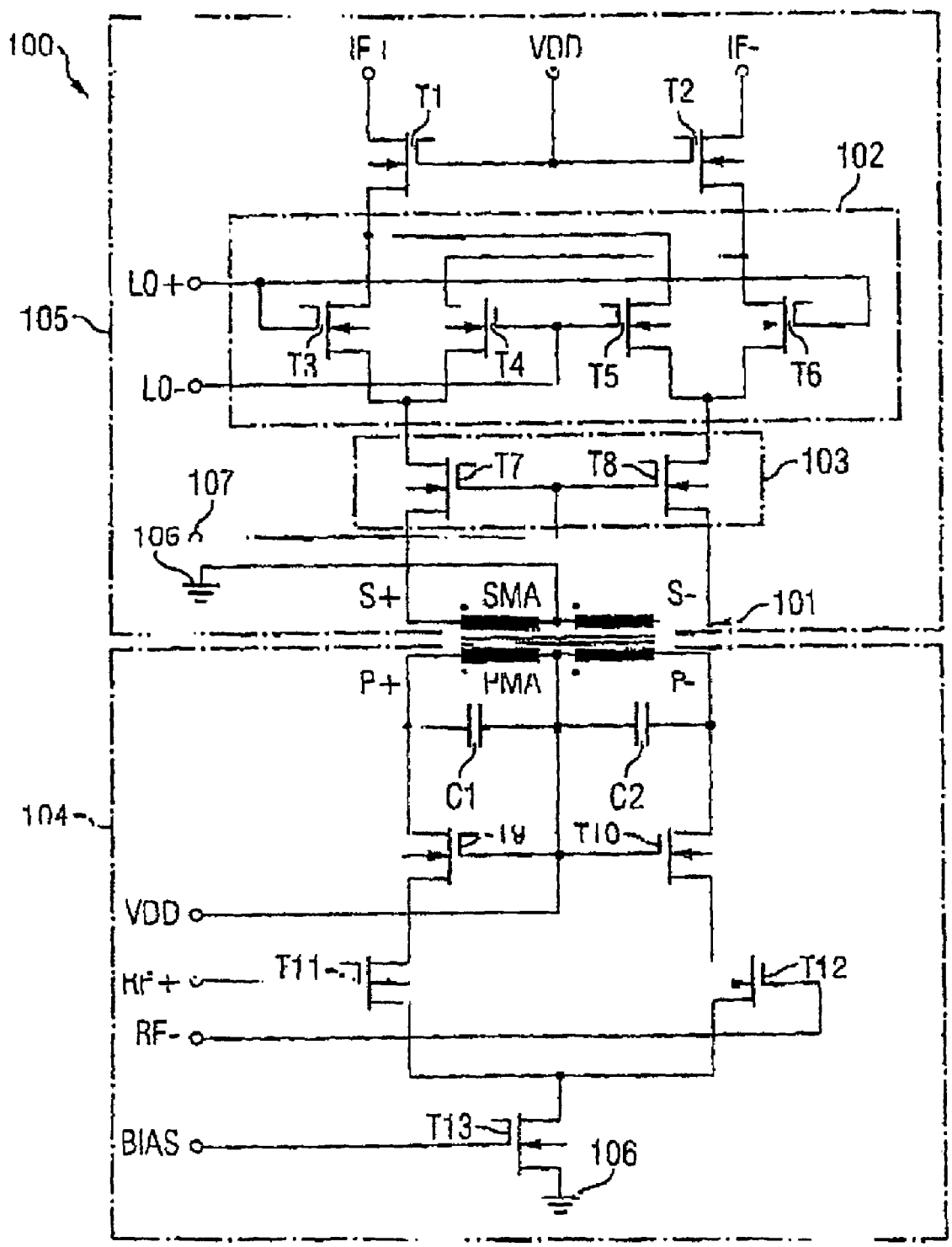
FIG. 1 shows an integrated circuit in accordance with a first exemplary embodiment of the invention.
Figure 2:
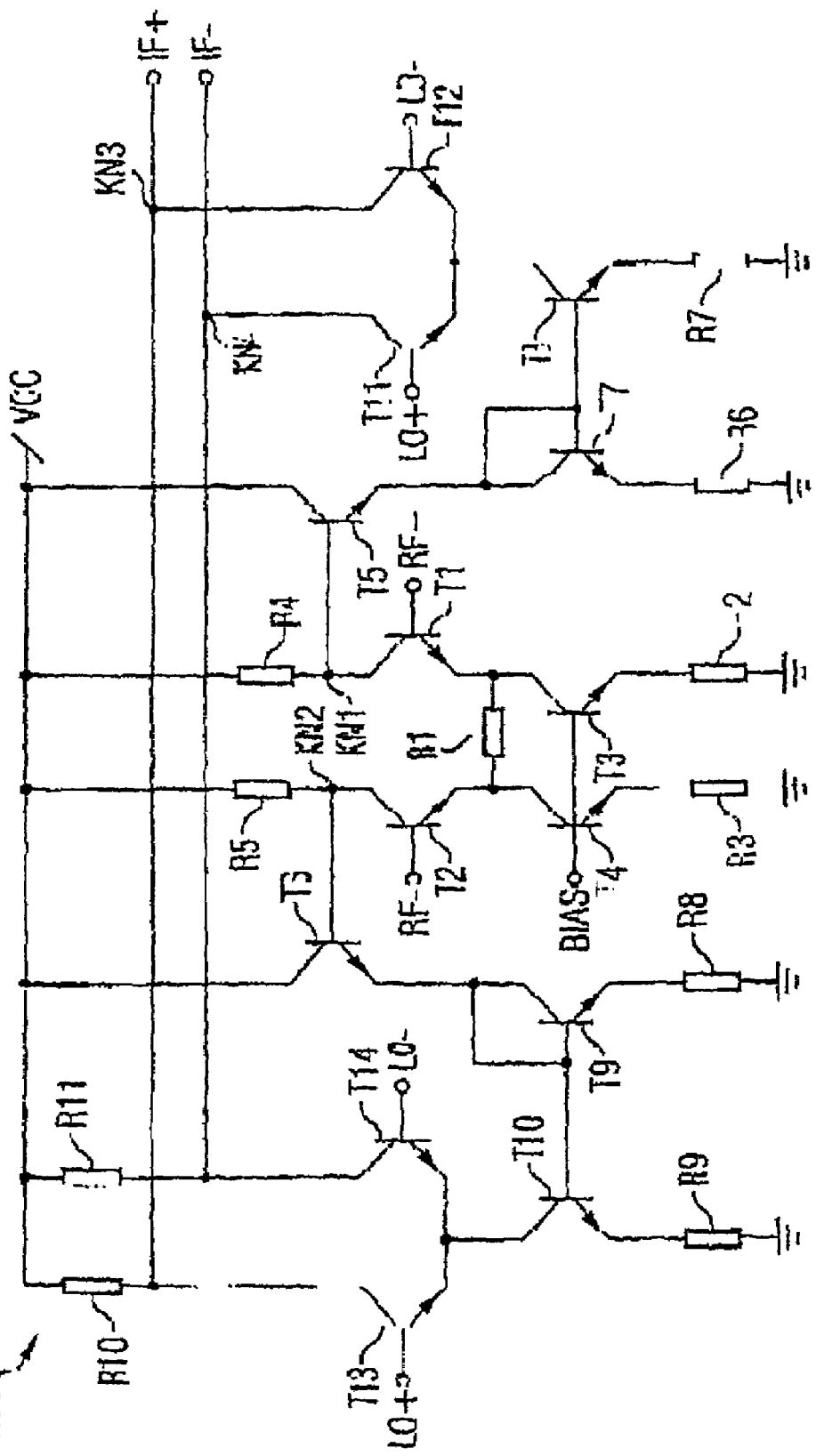
FIG. 2 shows a "current-folded" mixer circuit in accordance with the prior art.

FIG. 1 shows an integrated circuit 100 in accordance with a first exemplary embodiment of the invention.

The integrated circuit 100 in accordance with the first exemplary embodiment of the invention has a mixer circuit and a transformer 101. The mixer circuit, for its part, has an active mixer unit 102 with a signal-amplifying unit 103, two reference oscillator terminals LO+, LO−, two radiofrequency terminals RF+, RF− and two intermediate frequency terminals IF+, IF−. In this case, the integrated circuit 100 is set up in such a way that the transformer 101 decouples the two radiofrequency terminals RF+, RF− from the active mixer unit 102.

The transformer 101 thus clearly has the function of an isolating transformer. In accordance with the exemplary embodiment, all the active components of the integrated circuit 100 are realized by means of field effect transistors (=FET) in 120 nm CMOS technology. Moreover, the mixer circuit of the integrated circuit 100 is constructed in accordance with the HIPERLAN standard (HIPERLAN=high performance radio local area network) and, according to the invention, as a Gilbert mixer with which it is possible to achieve frequency conversion in the range of 17 GHz to 20 GHz.

Clearly, the transformer 101 divides the integrated circuit 100 into a first circuit section 104 and a second circuit section 105. In this case, the first circuit section 104 has the primary side of the transformer 101, two radiofrequency terminals RF+, RF−, a ground terminal 106, an operating voltage terminal VDD, a control voltage terminal BIAS and also two filter capacitors C1, C2, two differential amplifiers T11, T12, two amplifier cascodes T9, T10 and a control unit T13. The second circuit section 105 has the secondary side of the transformer 101, the active mixer unit 102, the signal-amplifying unit 103, the two reference oscillator terminals LO+, LO−, the two intermediate frequency terminals IF+, IF−, a ground terminal 106, an operating voltage terminal VDD, an amplifier voltage terminal 107 and also two amplifier cascodes T1, T2. For its part, the active mixer unit 102 has four mixer transistors T3, T4, T5, T6. By contrast, the signal-amplifying unit 103 has two amplifier cascodes T7, T8.

In accordance with the exemplary embodiment, the six amplifier cascodes T1, T2, T7, T8, T9, T10, the four mixer transistors T3, T4, T5, T6, the two differential amplifiers T11, T12 and the control unit T13 are realized by means of field effect transistors (=FET) in CMOS technology.

The gate electrode of the control unit T13 is electrically coupled to the control voltage terminal BIAS. The channel region of the control unit T13 can be made to conduct or block depending on the control voltage present, which is usually constant. As a result, the operating point of the integrated circuit 100 can be set precisely. As an alternative, the control unit T13 may also be realized by means of a controllable inductive component instead of by means of a FET. An example of a controllable inductive component that may be used is an integrated coil which is controllable by means of suitable variation of its number of turns and is described in detail in DE-Patent application, official file reference 101 62 263.5, applicant: Infineon Technologies AG, inventor: Tiebout M., for example. The source electrode of the control unit T13 is electrically coupled to the ground terminal 106 of the first circuit section 104. The drain electrode of the control unit T13 is electrically coupled to the source electrodes of the two differential amplifiers T11, T12.

By means of the two radiofrequency terminals RF+, RF−, it is possible to apply a radiofrequency signal via RF+ and the inverted radiofrequency signal with respect to the radiofrequency signal via RF− to the gate electrodes of the two differential amplifiers T11 and T12 and thus to couple them into the integrated circuit 100. The drain electrode of the differential amplifier T11 and T12 is electrically coupled to the source electrode of the amplifier cascode T9 and T10, respectively. The two amplifier cascodes T9, T10 serve to reduce the Miller capacitances occurring at the two differential amplifiers T11, T12 and thus for increasing the conductive transmission for electrical signals with high frequencies. Consequently, the two amplifier cascodes T9, T10 increase the reliability of the two differential amplifiers T11, T12.

The drain electrode of the amplifier cascode T9 and T10 is electrically coupled to the secondary side of a filter capacitor C1 and C2, respectively, and also to the primary positive terminal P+ and the primary negative terminal P−, respectively, of the transformer 101. The primary center terminal PMA of the transformer 101 is electrically coupled to the primary sides of the two filter capacitors C1, C2, to the gate electrodes of the two amplifier cascodes T9, T10 and also to the operating voltage terminal VDD. A primary positive winding is electrically coupled in between the primary positive terminal P+ and the primary center terminal PMA of the transformer 101, while a primary negative winding is electrically coupled in between the primary center terminal PMA and the primary negative terminal P− of the transformer 101.

The amplifier cascode T9 and T10 in each case forms, together with the filter capacitor C1 and C2, respectively, and also the primary positive winding and the primary negative winding, respectively, a filter unit that acts as a bandpass filter. In this case, the filter characteristic of said filter unit may be controlled by means of the operating voltage present at the operating voltage terminal VDD.

When a radiofrequency signal is present at the first circuit section 104 and the control unit T13 is correspondingly turned on, the differential amplifier T11 and T12 is turned on and the amplifier cascode T9 and T10, respectively, is turned on in the first circuit section 104, the secondary side of the transformer 101 supplies a current into the amplifier cascode T7 and T8, respectively, and thus into the second circuit section 105. For this purpose, the secondary center terminal SMA of the transformer 101 is electrically coupled to the ground potential, while the secondary positive terminal S+ of the transformer 101 is electrically coupled to the source electrode of the amplifier cascode T7 and the secondary negative terminal S− of the transformer 101 is electrically coupled to the source electrode of the amplifier cascode T8.

The gate electrodes of the two amplifier cascodes T7, T8 are electrically coupled to an amplifier voltage terminal 107. The amplifier voltage terminal 107 makes it possible to control the amplifier characteristic of the two amplifier cascodes T7, T8 by means of a suitable amplifier voltage that is present. The drain electrode of the amplifier cascode T7 and T8 is electrically coupled to the source electrodes of the two mixer transistors T3, T4 and T5, T6, respectively. The four mixer transistors T3, T4, T5, T6 form the active mixer unit 102, while the two amplifier cascodes T7, T8 form the signal-amplifying unit 103, which thus constitutes an input amplifier for the active mixer unit 102. The signal-amplifying unit 103 reduces undesirable parasitic capacitances at the source electrodes of the four mixer transistors T3, T4, T5, T6, as a result of which it is possible to achieve a higher resonant frequency in the transformer 101 and ultimately a higher operating frequency of the electronic circuit 100.

The gate electrodes of the two mixer transistors T3, T6 are electrically coupled to the reference oscillator terminal LO+, while the gate electrodes of the two mixer transistors T4, T5 are electrically coupled to the inverted reference oscillator terminal LO− with respect to the reference oscillator terminal LO+. The reference oscillator terminal LO+ makes it possible to couple a reference oscillator signal into the active mixer unit 102, while the inverted reference oscillator terminal LO− makes it possible to couple the inverted reference oscillator signal with respect to the reference oscillator signal into the active mixer unit 102.

The drain electrodes of the two mixer transistors T3, T5 and T4, T6, respectively, are electrically coupled to one another and also to the source electrode of an amplifier cascode T1 and T2, respectively. The drain electrode of the amplifier cascode T1 is electrically coupled to the intermediate frequency terminal IF+, while the drain electrode of the amplifier cascode T2 is electrically coupled to the inverted intermediate frequency terminal IF− with respect to the intermediate frequency terminal IF+. The gate electrodes of the two amplifier cascodes T1, T2 are electrically coupled to the operating voltage terminal VDD. In accordance with the operating voltage coupled in via the operating voltage terminal VDD, the two amplifier cascodes T1, T2 serve to amplify the signals between the two mixer transistors T3, T5 and T4, T6, respectively, and the corresponding intermediate frequency terminal IF+ and IF−, respectively. As a result, the two amplifier cascodes T1, T2 reduce the maximum voltages between the gate electrodes and the drain electrodes of the four mixer transistors T3, T4, T5, T6 thereby achieving a higher operational reliability for the electronic circuit 100.

Consequently, in the electronic circuit 100, in comparison with the prior art, it is possible to reduce the operating voltage and at the same time to achieve frequency conversion at very high frequencies.

Figure 3:
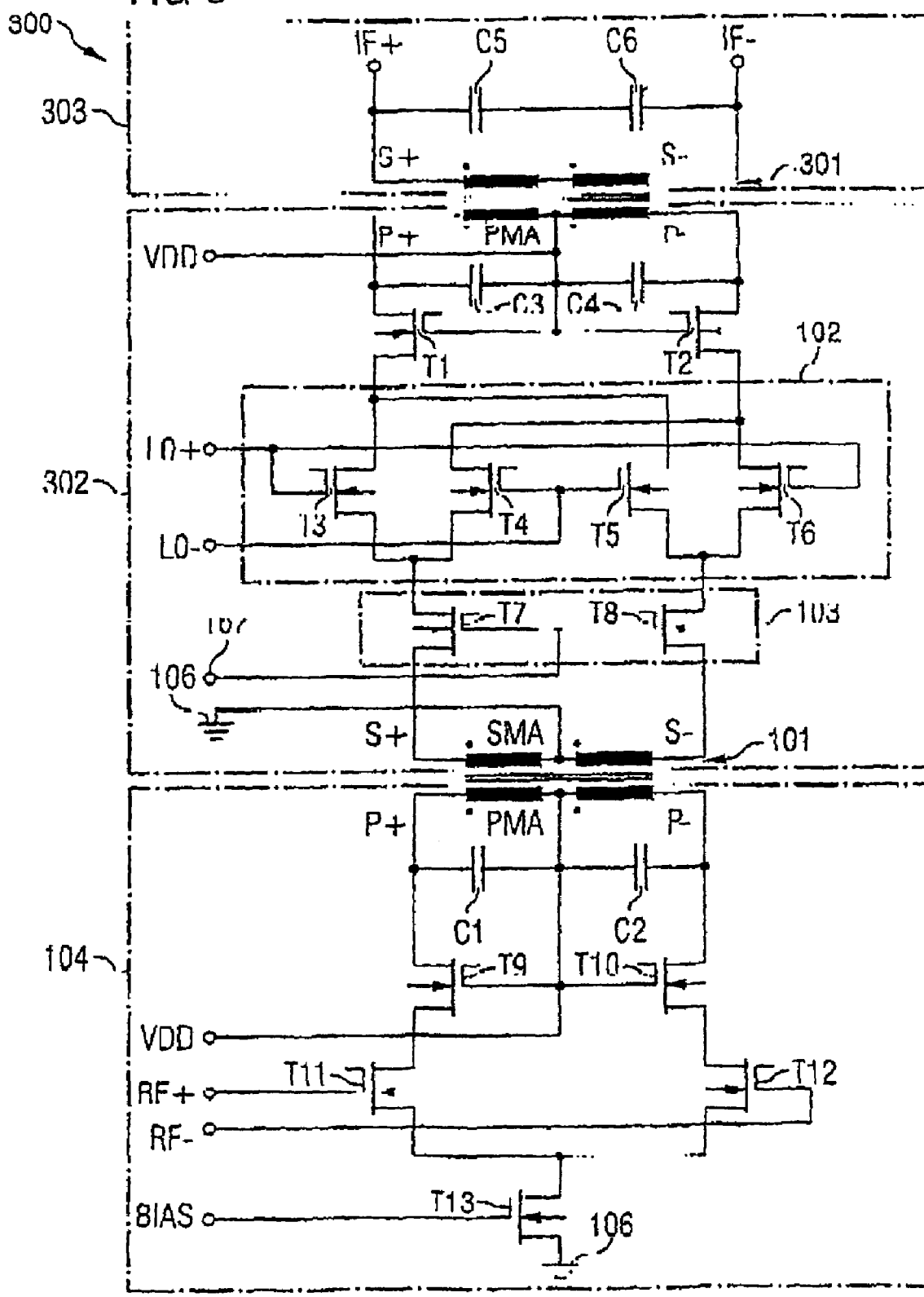
FIG. 3 shows an integrated circuit in accordance with a second exemplary embodiment of the invention.

FIG. 3 illustrates an integrated circuit 300 in accordance with a second exemplary embodiment of the invention.

The integrated circuit 300 in accordance with the second exemplary embodiment of the invention differs only slightly from the integrated circuit 100 in accordance with the first exemplary embodiment of the invention. Therefore, identical components are designated by identical reference symbols. Therefore, identical components which have already been described for the integrated circuit 100 in accordance with the first exemplary embodiment are not discussed again. For these components, reference should be made to the description concerning FIG. 1.

The integrated circuit 300 of the second exemplary embodiment differs from the integrated circuit 100 of the first exemplary embodiment essentially by virtue of the fact that an additional transformer 301 is provided between the active mixer unit 102 and the intermediate frequency terminals IF+, IF−. In accordance with the second exemplary embodiment, both the transformer 101 and the additional transformer 301 are integrated monolithically into the integrated circuit 300. The additional transformer 301 makes it possible to additionally reduce the operating voltage for the integrated circuit 300 and clearly functions as an isolating transformer. Consequently, the second circuit section 105 of the first exemplary embodiment is replaced by the second circuit section 302 of the second exemplary embodiment and a third circuit section 303. In this case, the second circuit section 302 of the second exemplary embodiment and the second circuit section 105 of the first exemplary embodiment are identical between the transformer 101 and the source electrodes of the two amplifier cascodes T1, T2.

The second circuit section 302 of the second exemplary embodiment additionally has the primary side of the additional transformer 301 and also two filter capacitors C3, C4.

The drain electrode of the amplifier cascode T1 and T2 is electrically coupled to the secondary side of the filter capacitor C3 and C4, respectively, and also to the primary positive terminal P+ and the primary negative terminal P−, respectively, of the additional transformer 301. The primary center terminal PMA of the additional transformer 301 is electrically coupled to the primary sides of the two filter capacitors C3, C4, to the gate electrodes of the two amplifier cascodes T1, T2 and also to the operating voltage terminal VDD. A primary positive winding is electrically coupled in between the primary positive terminal P+ and the primary center terminal PMA of the additional transformer 301, while a primary negative winding is electrically coupled in between the primary center terminal PMA and the primary negative terminal P− of the additional transformer 301.

The amplifier cascode T1 and T2 in each case forms, together with the filter capacitor C3 and C4, respectively, and also the primary positive winding and the primary negative winding, respectively, a filter unit that acts as a bandpass filter. In this case, the filter characteristic of said filter unit may be controlled by means of the operating voltage present at the operating voltage terminal VDD.

When an intermediate frequency signal is output from the active mixer unit 102 and the amplifier cascode T1 and T2, respectively, is correspondingly turned on in the second circuit section 302 of the second exemplary embodiment, the secondary side of the additional transformer 301 supplies a current to the two intermediate frequency terminals IF+, IF− and thus into the third circuit section 303. For this purpose, the secondary positive terminal S+ of the additional transformer 301 is electrically coupled to the intermediate frequency terminal IF+ and also to the secondary side of the filter capacitor C5 and the secondary negative terminal S− of the additional transformer 301 is electrically coupled to the inverted intermediate frequency terminal IF− with respect to the intermediate frequency terminal IF+ and also to the secondary side of the filter capacitor C6. Moreover, the primary sides of the filter capacitors C5, C6 are electrically coupled to one another.

In accordance with the second exemplary embodiment, the transformer 101 is designed for a maximum frequency to be transmitted of 20 GHz, while the additional transformer 301 is designed for a maximum frequency to be transmitted of 2 GHz.

Figure 4:
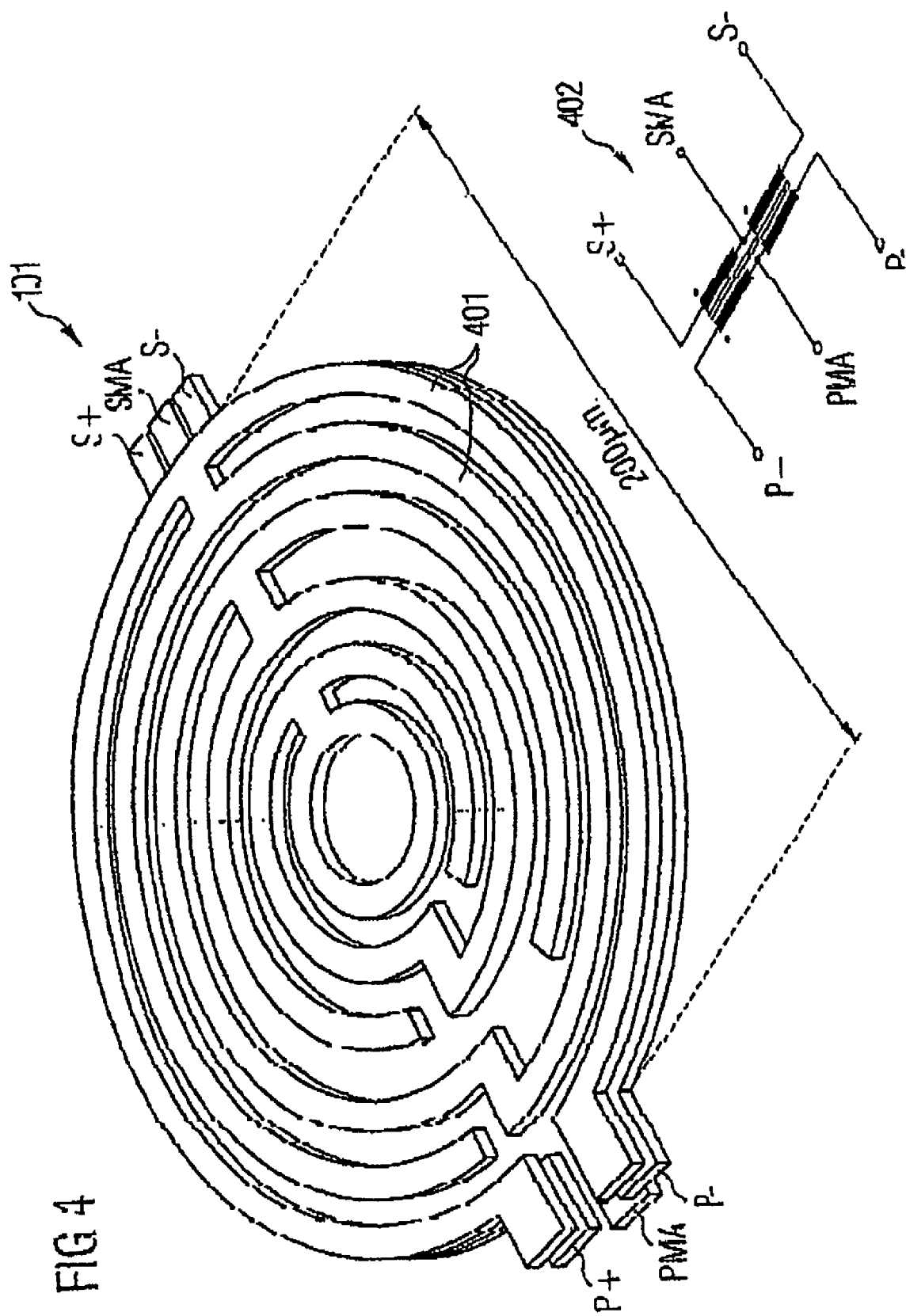
FIG. 4 shows a perspective plan view of a transformer for the integrated circuit according to the invention.

FIG. 4 shows a transformer 101 for the integrated circuits 100, 300 according to the invention.

The transformer 101, and analogously the additional transformer 301, is produced in monolithic fashion and has a spiral arrangement of turns 401, which essentially lie in two parallel planes and have an external diameter of about 200 μm. Such a monolithic transformer is described in detail in Simburger W., Wohlmuth H. D., Weger P., Heinz A.: "A Monolithic Transformer Coupled 5-W Silicon Paper Amplifier with 59% PAE at 0.9 GHZ" in IEEE J. of Solid-State Circuits, vol. 34, No. 12, pp. 1881-1892 (1999).

In addition, FIG. 4 illustrates the equivalent circuit diagram 402 corresponding to the transformer 101 in the same orientation as the transformer 101.

Moreover, it should be pointed out that the transformer 301 may be realized in particular by means of a transformer 101 in which only the secondary center terminal SMA remains without electrical contact-making.

What is claimed is:

1. An integrated circuit, comprising:
   a mixer circuit, which has a first circuit section and a second circuit section;
   the first circuit section having two radiofrequency terminals;
   the second circuit section having two reference oscillator terminals, an active mixer unit with a signal-amplifying unit, and two intermediate frequency terminals, wherein the active mixer unit and the signal-amplifying unit have a common current path;
   a transformer that directly electrically decouples the two radiofrequency terminals from the active mixer unit, and couples the first circuit section and the second circuit section together such that each of the two circuit sections is separately supplied with a full operating voltage of the integrated circuit; and
   wherein the first circuit section further comprises at least one filter element connected between the radiofrequency terminals and the transformer, and the at least one filter element is connected to the full operating voltage of the integrated circuit.

2. The integrated circuit as claimed in claim 1, wherein the signal-amplifying unit is an input amplifier of the active mixer unit.

3. The integrated circuit as claimed in claim 1, further comprising an amplifier circuit located between the two radiofrequency terminals and the transformer.

4. The integrated circuit as claimed in claim 1, wherein the filter element has a cascode.

5. The integrated circuit as claimed in claim 1, wherein the filter element has a bandpass filter.

6. The integrated circuit as claimed in claim 5, wherein the bandpass filter is realized by at least one capacitor.

7. The integrated circuit as claimed in claim 1, further comprising a cascode connected between the two radiofrequency terminals and the transformer.

8. The integrated circuit as claimed in claim 1, further comprising a cascode connected between the transformer and the active mixer unit.

9. The integrated circuit as claimed in claim 1, further comprising a cascode connected between the active mixer unit and the two intermediate frequency terminals.

10. The integrated circuit as claimed in claim 1, wherein the transformer is a monolithic transformer.

11. The integrated circuit as claimed in claim 1, further comprising a control element that sets the operating point of the integrated circuit.

12. The integrated circuit as claimed in claim 11, wherein the control element is a controllable inductive component.

13. The integrated circuit as claimed in claim 1, wherein at least one of the active mixer unit, the amplifier circuit, and a cascode has at least one field effect transistor.

14. The integrated circuit as claimed in claim 1, wherein the mixer circuit is a Gilbert mixer.

15. An integrated circuit, comprising:
    a mixer circuit, which has a first circuit section and a second circuit section;
    the first circuit section having two radiofrequency terminals;
    the second circuit section having two reference oscillator terminals, an active mixer unit with a signal-amplifying unit, and two intermediate frequency terminals, wherein the active mixer unit and the signal-amplifying unit have a common current path;
    a first transformer that directly electrically decouples the two radiofrequency terminals from the active mixer unit, and couples the first circuit section and the second circuit section together such that each of the two circuit sections is separately supplied with a full operating voltage of the integrated circuit; and
    a second transformer connected between the active mixer unit and the two intermediate frequency terminals.

16. The integrated circuit as claimed in claim 15, wherein the second transformer is a monolithic transformer.

17. The integrated circuit as claimed in claim 15, wherein the signal-amplifying unit is an input amplifier of the active mixer unit.

18. The integrated circuit as claimed in claim 15, further comprising an amplifier circuit connected between the two radiofrequency terminals and the transformer.

19. The integrated circuit as claimed in claim 15, further comprising at least one filter element connected between the radio frequency terminals and the first transformer.

20. The integrated circuit as claimed in claim 19, wherein the filter element has a cascode.

21. The integrated circuit as claimed in claim 19, wherein the filter element has a bandpass filter.

22. The integrated circuit as claimed in claim 21, wherein the bandpass filter is realized by at least one capacitor.

23. The integrated circuit as claimed in claim 15, further comprising a cascode connected between the two radiofrequency terminals and the transformer.

24. The integrated circuit as claimed in claim 15, further comprising a cascode connected between the transformer and the active mixer unit.

25. The integrated circuit as claimed in claim 15, further comprising a cascode connected between the active mixer unit and the two intermediate frequency terminals.

26. The integrated circuit as claimed in claim 15, wherein each of the first transformer and the second transformer is a monolithic transformer.

27. The integrated circuit as claimed in claim 15, further comprising a control element that sets the operating point of the integrated circuit.

28. The integrated circuit as claimed in claim 27, wherein the control element is a controllable inductive component.

29. The integrated circuit as claimed in claim 15, wherein at least one of the active mixer unit, the amplifier circuit, and a cascode has at least one field effect transistor.

30. The integrated circuit as claimed in claim 15, wherein the mixer circuit is a Gilbert mixer.

\* \* \* \* \*